(12) United States Patent
Masuda

(10) Patent No.: US 10,122,340 B2
(45) Date of Patent: Nov. 6, 2018

(54) LC FILTER

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/849,938

(22) Filed: Dec. 21, 2017

(65) Prior Publication Data

US 2018/0115295 A1 Apr. 26, 2018

Related U.S. Application Data

(63) Continuation of application No. PCT/JP2016/070153, filed on Jul. 7, 2016.

(30) Foreign Application Priority Data

Jul. 22, 2015 (JP) ................................ 2015-144497

(51) Int. Cl.
| | |
|---|---|
| *H03H 7/075* | (2006.01) |
| *H01F 17/00* | (2006.01) |
| *H01F 27/00* | (2006.01) |
| *H01P 1/203* | (2006.01) |
| *H03H 7/01* | (2006.01) |
| *H03H 1/00* | (2006.01) |

(52) U.S. Cl.
CPC ............ *H03H 7/075* (2013.01); *H01F 17/00* (2013.01); *H01F 27/00* (2013.01); *H01P 1/20345* (2013.01); *H03H 7/0115* (2013.01); *H03H 2001/0085* (2013.01)

(58) Field of Classification Search
CPC ......... H03H 2001/0085; H03H 7/0115; H03H 7/075
USPC .................................................. 333/175, 185
See application file for complete search history.

(56) References Cited

U.S. PATENT DOCUMENTS

| | | | |
|---|---|---|---|
| 2005/0053226 A1* | 3/2005 | Taniguchi | ............... H03H 7/42 379/390.02 |
| 2007/0241839 A1* | 10/2007 | Taniguchi | ............... H03H 7/09 333/185 |
| 2013/0009726 A1 | 1/2013 | Sasaki | |

(Continued)

FOREIGN PATENT DOCUMENTS

| | | |
|---|---|---|
| JP | 2-189012 A | 7/1990 |
| JP | 4-355902 A | 12/1992 |

(Continued)

OTHER PUBLICATIONS

Official Communication issued in International Patent Application No. PCT/JP2016/070153, dated Sep. 27, 2016.

(Continued)

*Primary Examiner* — Rakesh Patel
(74) *Attorney, Agent, or Firm* — Keating & Bennett, LLP

(57) ABSTRACT

An LC filter includes a laminate including insulating layers laminated in a lamination direction, an inductor having a spiral or helical shape around an axis parallel or substantially parallel to the lamination direction, and a capacitor in which capacitor conductors face each other. The inductor and the capacitor do not overlap as viewed from the lamination direction and all directions orthogonal or substantially orthogonal to the lamination direction.

8 Claims, 7 Drawing Sheets

(56) References Cited

U.S. PATENT DOCUMENTS

2015/0188508 A1   7/2015  Masuda
2016/0028358 A1   1/2016  Yosui
2016/0233845 A1   8/2016  Masuda et al.

FOREIGN PATENT DOCUMENTS

| JP | 10-65476 A | 3/1998 |
|----|------------|--------|
| JP | 2001-244140 A | 9/2001 |
| JP | 2003-023332 A | 1/2003 |
| JP | 2006-222797 A | 8/2006 |
| JP | 2013-21449 A | 1/2013 |
| WO | 2009/041294 A1 | 4/2009 |
| WO | 2014/045648 A1 | 3/2014 |
| WO | 2014/185231 A1 | 11/2014 |
| WO | 2015/064133 A1 | 5/2015 |

OTHER PUBLICATIONS

Official Communication issued in corresponding Japanese Patent Application No. 2017-529539, dated Jan. 23, 2018.

\* cited by examiner

LC FILTER

CROSS REFERENCE TO RELATED APPLICATIONS

This application claims the benefit of priority to Japanese Patent Application No. 2015-144497 filed on Jul. 22, 2015 and is a Continuation Application of PCT Application No. PCT/JP2016/070153 filed on Jul. 7, 2016. The entire contents of each application are hereby incorporated herein by reference.

BACKGROUND OF THE INVENTION

1. Field of the Invention

The present invention relates to an LC filter including an inductor and a capacitor.

2. Description of the Related Art

As an invention concerning an LC filter in the related art, a low-pass filter disclosed in Japanese Unexamined Patent Application Publication No. 2013-21449, for example, is known. The low-pass filter includes a laminate, a coil, and a capacitor. In the laminate, a plurality of insulating layers are laminated in a lamination direction. The coil is incorporated in the laminate, and has a helical shape turning around an axis parallel to a lamination direction. The capacitor is disposed between a bottom surface of the laminate and the coil, and overlaps the coil as viewed from the lamination direction.

In the low-pass filter disclosed in Japanese Unexamined Patent Application Publication No. 2013-21449, a decrease in Q value is a problem. More specifically, since the axis around which the coil turns is parallel to the lamination direction, a magnetic flux generated by the coils extends along the lamination direction. Since the capacitor overlaps the coil as viewed from the lamination direction, the magnetic flux passes through the capacitor. As a result, an eddy current is generated in the capacitor and the Q value of the low-pass filter decreases.

As a method for solving this problem, the configuration of an inductor included in a laminated band-pass filter disclosed in, for example, International Publication No. 2009/041294 is considered. The inductor is configured such that a magnetic flux generated by the inductor extends in a direction orthogonal to a lamination direction (top-bottom direction). More specifically, the inductor included in the laminated band-pass filter is a loop-type inductor including two via electrodes and an inductor electrode. The inductor electrode is a linear conductor disposed near the top surface of a laminate. The two via electrodes extend downwardly from both ends of the inductor electrode. Such an inductor generates a magnetic flux extending in a direction orthogonal to a lamination direction (top-bottom direction). This reduces the penetration of the magnetic flux through a capacitor disposed below the inductor and the decrease in Q value of the laminated band-pass filter.

However, since the loop-type inductor is used in the laminated band-pass filter disclosed in International Publication No. 2009/041294, the inductance value of the inductor is determined in accordance with the height of a laminate. Accordingly, in order to obtain a large inductance value, a tall laminate is needed. In a case where a loop-type inductor is used, it is therefore difficult to achieve both the size reduction of an element and the increase in inductance value.

SUMMARY OF THE INVENTION

Preferred embodiments of the present invention provide LC filters with which a large inductance value is able to be obtained and a Q value is able to be improved.

An LC filter according to a preferred embodiment of the present invention includes a laminate including a plurality of insulating layers laminated in a lamination direction, an inductor having a spiral or helical shape turning around an axis parallel or substantially parallel to the lamination direction, and a capacitor in which a plurality of capacitor conductors face each other. The inductor and the capacitor do not overlap as viewed from the lamination direction and all directions orthogonal or substantially orthogonal to the lamination direction.

According to preferred embodiments of the present invention, a large inductance value is able be obtained and a Q value is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
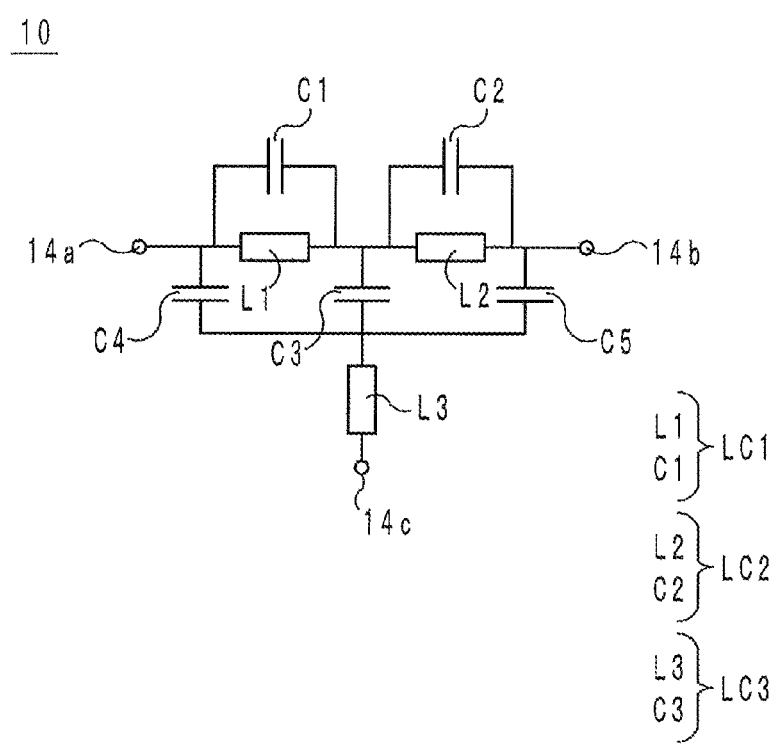
FIG. 1 is an equivalent circuit diagram of an LC filter 10.

A circuit configuration of an LC filter 10 according to a preferred embodiment of the present invention will be described with reference to the accompanying drawings. FIG. 1 is an equivalent circuit diagram of the LC filter 10.

As illustrated in FIG. 1, the LC filter 10 includes inductors L1 to L3, capacitors C1 to C5, and outer electrodes 14a to 14c. The outer electrodes 14a and 14b are high-frequency signal input/output terminals. The outer electrode 14c is a ground terminal connected to a ground potential.

The inductor L1 and the capacitor C1 are electrically connected in parallel to define an LC parallel resonator LC1. The inductor L2 and the capacitor C2 are electrically connected in parallel to define an LC parallel resonator LC2. The LC parallel resonators LC1 and LC2 are connected in series in this order between the outer electrodes 14a and 14b. The inductors L1 and L2 are electromagnetically coupled to each other.

One electrode of the capacitor C3 is connected between the LC parallel resonators LC1 and LC2. One electrode of a capacitor C4 is connected to the outer electrode 14a. One electrode of the capacitor C5 is connected to the outer electrode 14b. The other electrodes of the capacitors C3 to C5 are connected to one end of the inductor L3. The other end of the inductor L3 is connected to the outer electrode 14c. The inductor L3 and the capacitor C3 are electrically connected in series to define an LC series resonator LC3.

The LC filter 10 having the above-described configuration is structured and functions as a low-pass filter that passes a high-frequency signal having a frequency lower than or equal to a cutoff frequency (preferably about 1.575 GHz in this preferred embodiment) between the outer electrodes 14a and 14b. Descriptions will be provided by taking a case in which a high-frequency signal is input from the outer electrode 14a as an example.

Each of the LC parallel resonators LC1 and LC2 has a resonant frequency (for example, about 1.8 GHz) slightly higher than the cutoff frequency. A high-frequency signal having the resonant frequency of the LC parallel resonators LC1 and LC2 therefore cannot pass through the LC parallel resonators LC1 and LC2 after being input from the outer electrode 14a and does not output from the outer electrode 14b.

The LC series resonator LC3 has a resonant frequency (for example, about 5 GHz) higher than the cutoff frequency. A high-frequency signal having the resonant frequency of the LC series resonator LC3 is therefore output from the outer electrode 14c via the LC series resonator LC3 after being input from the outer electrode 14a, and does not output from the outer electrode 14b The capacitors C4 and C5 lead a high-frequency signal having a frequency higher than the cutoff frequency, which has been input from the outer electrode 14a, to the outer electrode 14c. With the above-described configuration, a high-frequency signal having a frequency lower than the cutoff frequency is able to pass between the outer electrodes 14a and 14b and a high-frequency signal having a frequency higher than the cutoff frequency is not able to pass between the outer electrodes 14a and 14b.

Figure 2:
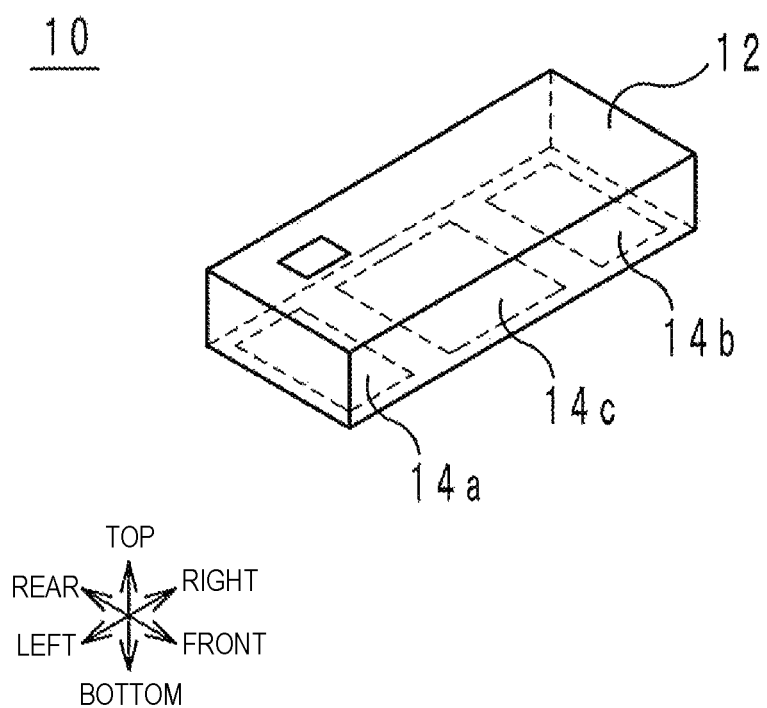
FIG. 2 is an external perspective view of the LC filter 10.
Figure 3:
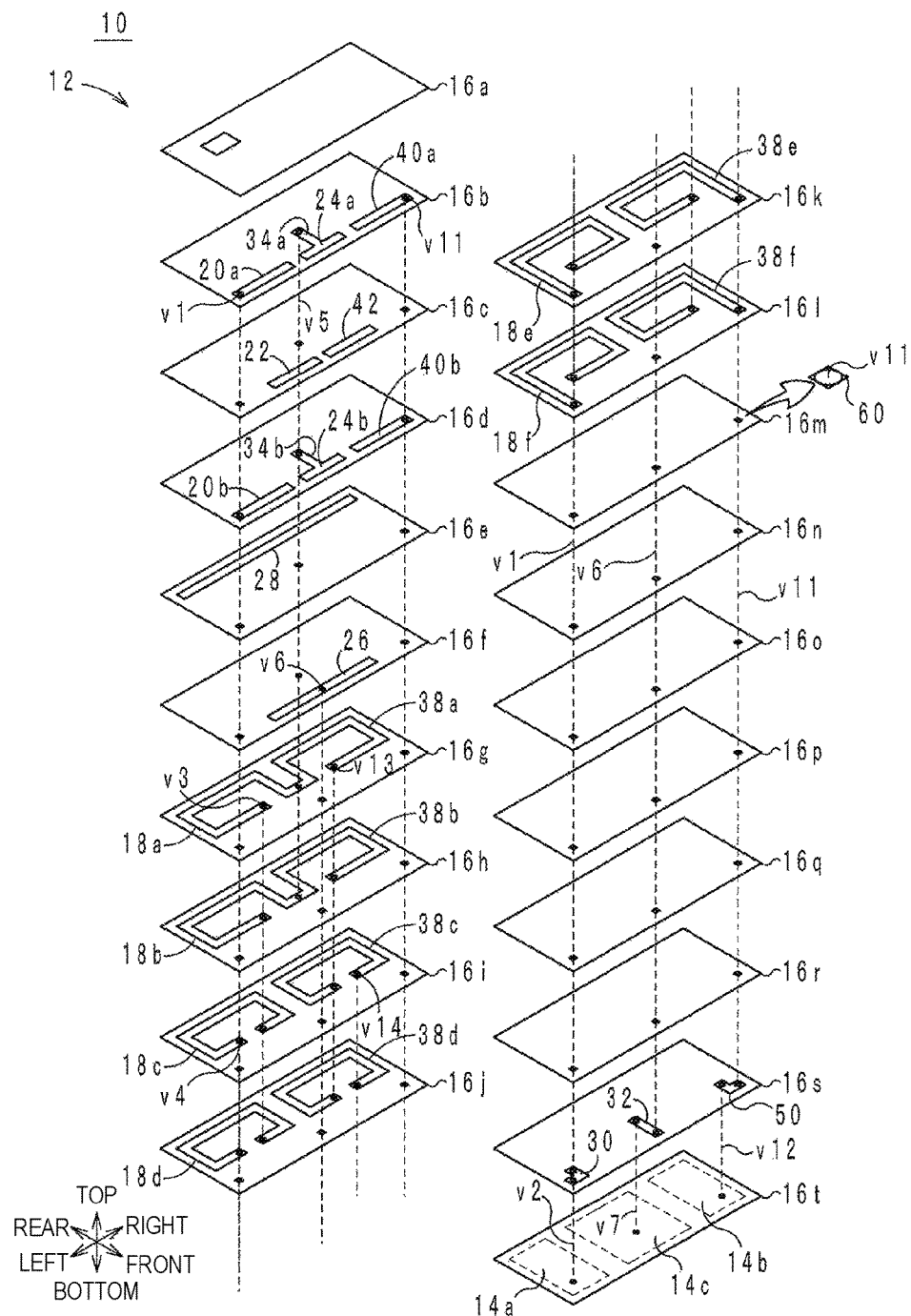
FIG. 3 is an exploded perspective view of the LC filter 10.
Figure 4A:
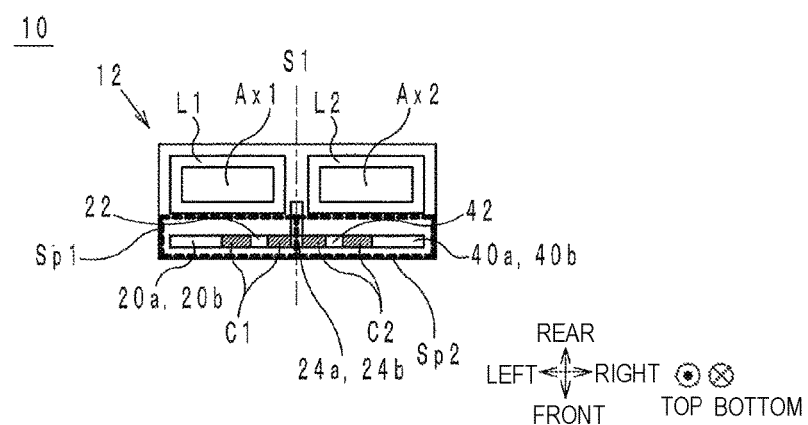
FIG. 4A is a perspective view of the LC filter 10 taken from above (a lamination direction).
Figure 4B:
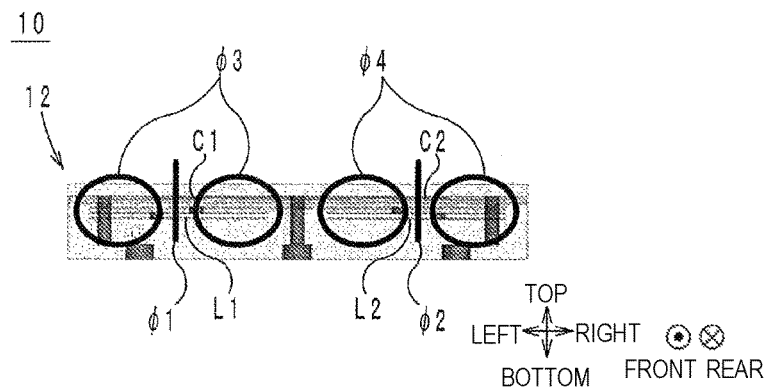
FIG. 4B is a perspective view of the LC filter 10 taken from the front.
Figure 4C:
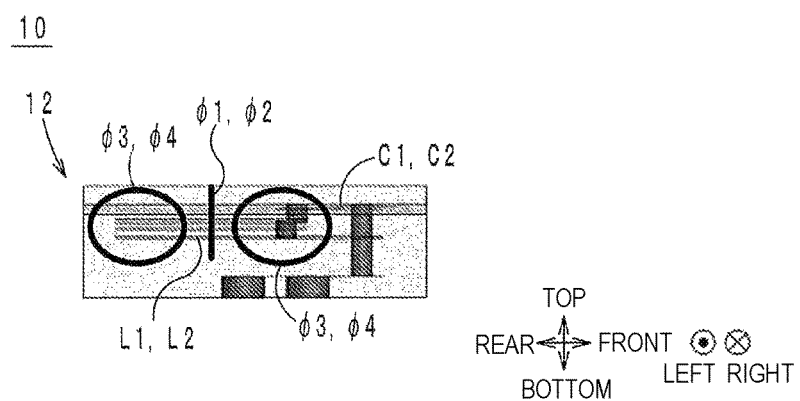
FIG. 4C is a perspective view of the LC filter 10 taken from the left.

Next, the detailed configuration of the LC filter 10 will be described with reference to the accompanying drawings. FIG. 2 is an external perspective view of the LC filter 10. FIG. 3 is an exploded perspective view of the LC filter 10. FIG. 4A is a perspective view of the LC filter 10 taken from above (a lamination direction). FIG. 4B is a perspective view of the LC filter 10 taken from the front. FIG. 4C is a perspective view of the LC filter 10 taken from the left. In the LC filter 10, the lamination direction of a laminate 12 is defined as a top-bottom direction. The longitudinal direction of the top surface of the LC filter 10, as viewed from above, is defined as a right-left direction, and the width direction of the top surface of the LC filter 10, as viewed from above, is defined as a front-rear direction.

As illustrated in FIGS. 2 and 3, the LC filter 10 includes the laminate 12, the outer electrodes 14a to 14c, inductor conductive layers 18a to 18f and 38a to 38f, capacitor conductive layers 20a, 20b, 22, 24a, 24b, 26, 40a, 40b, and 42, a coupling conductive layer 28, connecting conductive layers 30, 32, 34a, 34b, and 50, and via-hole conductors v1 to v7 and v11 to v14.

The laminate 12 preferably has a rectangular or substantially rectangular parallelepiped shape as illustrated in FIG. 2, and includes insulating layers 16a to 16t laminated in this order from the top side to the bottom side as illustrated in FIG. 3. The top surface of the laminate 12 is located at the top end of the laminate 12. The bottom surface (the insulating layer 16t) of the laminate 12 is located at the bottom end of the laminate 12, and faces a circuit board when the LC filter 10 is disposed on the circuit board.

Each of the insulating layers 16a to 16t preferably has a rectangular or substantially rectangular shape with long sides extending in the right-left direction as viewed from above, and preferably is made of, for example, ceramic. The upper surfaces of the insulating layers 16a to 16t will hereinafter be referred to as top surfaces, and the lower surfaces thereof will hereinafter be referred to as bottom surfaces.

The outer electrodes 14a to 14c are disposed on only the bottom surface of the laminate 12, and are not disposed on the front, rear, right and left surfaces of the laminate 12. Each of the outer electrodes 14a to 14c preferably has a rectangular or substantially rectangular shape. The outer electrodes 14a, 14c, and 14b are arranged in this order from the left side to the right side on the bottom surface of the laminate 12. The outer electrodes 14a to 14c are preferably formed by applying Ni- and Sn-plating or Ni- and Au-plating in this order on a base electrode made of, for example, silver. The elements at the laminate 12 will be described in ascending numeric order of the capacitors and the inductors in the equivalent circuit illustrated in FIG. 1.

The inductor L1 includes the inductor conductive layers 18a to 18f and the via-hole conductors v3 and v4 which are connected. The inductor conductive layers 18a to 18f are disposed in the left half regions of the top surfaces of the insulating layers 16g to 16l, respectively, and each preferably have a shape in which a portion of a rectangular or substantially rectangular ring is cut out. The inductor conductive layers 18a to 18f therefore encircle the perimeter of an axis Ax1 (see FIG. 4A) parallel or substantially parallel to the top-bottom direction. The inductor conductive layers 18a to 18f overlap one another as viewed from above to define a single rectangular or substantially rectangular ring. The inductor conductive layers 18a to 18f are disposed spaced apart from the long sides of the insulating layers 16g to 16l on the front side, respectively, as viewed from above. As a result, space Sp1 is provided on the front side of the inductor L1 as illustrated in FIG. 4A. Preferably, the inductor conductive layers 18a and 18b have the same or substantially the same shape, the inductor conductive layers 18c and 18d have the same or substantially the same shape, and the inductor conductive layers 18e and 18f have the same or substantially the same shape. Upstream end portions of the inductor conductive layers 18a to 18f in a clockwise direction will hereinafter be referred to as upstream ends, downstream end portions thereof in the clockwise direction will hereinafter be referred to as downstream ends.

The via-hole conductor v4 passes through the insulating layers 16i to 16k in the top-bottom direction, and connects the downstream ends of the inductor conductive layers 18e and 18f and the upstream ends of the inductor conductive layers 18c and 18d. The via-hole conductor v3 passes through the insulating layers 16g to 16i in the top-bottom direction, and connects the downstream ends of the inductor conductive layers 18c and 18d and the upstream ends of the inductor conductive layers 18a and 18b. The inductor L1 having the above-described configuration is provided with a helical shape such that it advances to the top side while turning around the axis Ax1 (see FIG. 4A) parallel or substantially parallel to the top-bottom direction clockwise.

The capacitor C1 includes the capacitor conductive layers 20a, 20b, 22, 24a, and 24b. The capacitor conductive layers 20a, 20b, and 22 are disposed in the left half regions of the top surfaces of the insulating layers 16b, 16d, and 16c, respectively, and have linear shapes extending along the left halves of the long sides of the insulating layers 16b, 16d, and 16c on the front side, respectively. The capacitor conductive layers 20a and 20b preferably have the same or substantially the same shape and overlap each other. In contrast, the capacitor conductive layer is shifted to the right side from the capacitor conductive layers 20a and 20b. The right ends of the capacitor conductive layers 20a and 20b therefore face the left end of the capacitor conductive layer 22.

The capacitor conductive layers 24a and 24b are disposed at the centers or approximate centers of the top surfaces of the insulating layers 16b and 16d, respectively, and have linear shapes extending along the center portions of the long sides of the insulating layers 16b and 16d on the front side, respectively. As a result, the right end of the capacitor conductive layer 22 and the left ends of the capacitor conductive layers 24a and 24b face each other.

A capacitor in which the right ends of the capacitor conductive layers 20a and 20b and the left end of the capacitor conductive layer 22 face each other and a capacitor in which the right end of the capacitor conductive layer 22 and the left ends of the capacitor conductive layers 24a and 24b face each other are connected in series via the capacitor conductive layer 22, so that the rectangular capacitor C1 is provided as represented by hatched portions in FIG. 4A.

The inductor L1 and the capacitor C1 are electrically connected in parallel via the via-hole conductors v1, v2, and v5 and the connecting conductive layers 30, 34a, and 34b. More specifically, the connecting conductive layer 30 is preferably an L-shaped conductive layer provided in the left half region of the top surface of the insulating layer 16s. The via-hole conductor v2 passes through the insulating layers 16s and 16t in the top-bottom direction, and connects one end of the connecting conductive layer 30 and the outer electrode 14a. The via-hole conductor v1 passes through the insulating layers 16b to 16r in the top-bottom direction, and connects the other end of the connecting conductive layer 30, the upstream ends of the inductor conductive layers 18e and 18f, and the left ends of the capacitor conductive layers 20a and 20b.

The connecting conductive layers 34a and 34b are provided on the top surfaces of the insulating layers 16b and 16d, respectively, and have linear shapes extending from the centers or approximate centers of the capacitor conductive layers 24a and 24b in the right-left direction to the rear side, respectively. The via-hole conductor v5 passes through the insulating layers 16b to 16g in the top-bottom direction, and connects the rear ends of the conductive layers 34a and 34b and the downstream ends of the inductor conductive layers 18a and 18b (the upstream ends of the inductor conductive layers 38a and 38b).

The capacitor C3 includes the capacitor conductive layers 24b and 26. The capacitor conductive layer 26 is provided on the top surface of the insulating layer 16f and has a linear shape extending along the long side of the insulating layer 16f on the front side. The capacitor conductive layer 24b and the capacitor conductive layer 26 face each other, so that the capacitor C3 is defined.

The capacitor C4 includes the capacitor conductive layers 20b and 26. The right end of the capacitor conductive layer 20b and the left end of the capacitor conductive layer 26 face each other, so that the capacitor C4 is defined.

The inductor L3 includes the via-hole conductor v6. The via-hole conductor v6 passes through the insulating layers 16f to 16r in the top-bottom direction. The top end of the via-hole conductor v6 is connected to the center or approximate center of the capacitor conductive layer 26 in the right-left direction. As a result, the inductor L3 is electrically connected in series to the capacitors C3 and C4.

The inductor L3 is connected to the outer electrode 14c via the connecting conductive layer 32 and the via-hole conductor v7. The connecting conductive layer 32 is provided on the top surface of the insulating layer 16s, and has a linear shape extending in the front-rear direction. The bottom end of the via-hole conductor v6 is connected to the front end of the connecting conductive layer 32. The via-hole conductor v7 passes through the insulating layers 16s and 16t in the top-bottom direction, and connects the rear end of the connecting conductive layer 32 and the outer electrode 14c. As a result, the inductor L3 is connected to the outer electrode 14c.

As will be described below, the LC filter 10 is preferably symmetric or substantially symmetric with respect to a plane S1 as viewed from above. The plane S1 passes through the center or approximate center (an intersection point of diagonal lines) of the top surface of the laminate 12, and is parallel or substantially parallel to the top-bottom direction as illustrated in FIG. 4A. Accordingly, the following relationships (1) to (4) are established.

(1) The inductor conductive layers 38a to 38f and the via-hole conductors v13 and v14 which define the inductor L2 are symmetric or substantially symmetric to the inductor conductive layers 18a to 18f and the via-hole conductors v3 and v4 which define the inductor L1 with respect to the plane S1.

(2) The capacitor conductive layers 40a, 40b, 42, 24a, and 24b defining the capacitor C2 are symmetric or substantially symmetric to the capacitor conductive layers 20a, 20b, 22, 24a, and 24b defining the capacitor C1 with respect to the plane S1.

(3) The via-hole conductors v11, v12, and v5 and the connecting conductive layers 50, 34a, and 34b which electrically connect the inductor L2 and the capacitor C2 in parallel are symmetric or substantially symmetric to the via-hole conductors v1, v2, and v5 and the connecting conductive layers 30, 34a, and 34b which electrically connect the inductor L1 and the capacitor C1 in parallel with respect to the plane S1.

(4) The capacitor conductive layers 40b and 26 defining the capacitor C5 are symmetric or substantially symmetric to the capacitor conductive layers 20b and 26 defining the capacitor C4 with respect to the plane S1.

The detailed descriptions of the inductor conductive layers 38a to 38f, the capacitor conductive layers 40a, 40b, and 42, the connecting conductive layer 50, and the via-hole conductors v11 to v14 will be omitted.

The coupling conductive layer 28 is provided on the top surface of the insulating layer 16e, and has a linear shape extending along the long side of the insulating layer 16e on the rear side. The coupling conductive layer 28 overlaps the inductors L1 and L2 as viewed from above. As a result, the inductors L1 and L2 are electromagnetically coupled to each other via the coupling conductive layer 28.

Each of the via-hole conductors v1, v5, v6, and v11 passes through a plurality of insulating layers in the top-bottom direction. Some of these insulating layers are not connected to line electrodes. Land conductive layers 60 (see FIG. 3) are therefore provided to prevent the occurrence of a break at the via-hole conductors v1, v5, v6, and v11 caused by misalignment in the lamination of the insulating layers. The land conductive layers 60 preferably have a square or substantially square shape, and have respective areas slightly larger than the cross sections of the via-hole conductors v1, v5, v6, and v11 which are vertical to the top-bottom direction. The land conductive layers 60 are provided on the respective top surfaces of the insulating layers to overlap the via-hole conductors v1, v5, v6, and v11.

Accordingly, at the insulating layers 16m to 16r, there is no conductor other than the via-hole conductors v1, v6, and v11 passing through them in a straight line in the top-bottom direction and the land conductive layers 60 that relay corresponding connections of the via-hole conductors v1, v6, and v11 at the boundaries between adjacent ones of the insulating layers 16m to 16r. Among the insulating layers 16m to 16t provided between the inductors L1 and L2 and the bottom surface of the laminate 12, the insulating layers 16m to 16r are continuously laminated. Thus, providing the insulating layers 16m to 16r at which unnecessary conductors are not disposed between the inductors L1 and L2 and the bottom surface of the laminate 12 increases the distance between the inductors L1 and L2 and the outer electrodes 14a to 14c.

The relative dielectric constant of the insulating layers 16b to 16e is preferably larger than that of the insulating layers 16a and 16f to 16t. The relative dielectric constant of the insulating layers 16b to 16e sandwiched by the capacitor conductive layers 20a, 20b, 22, 24a, 24b, 26, 40a, 40b, and 42 in the top-bottom direction is therefore larger than that of the insulating layers 16g to 16l where the inductors L1 and L2 are disposed. Accordingly, by increasing a relative dielectric constant, a capacitance value per unit is able to be increased.

For the improvement in Q value of the LC filter 10, the capacitor C1 is located in the space Sp1 as viewed from above as illustrated in FIG. 4A. The inductor L1 and the capacitor C1 therefore do not overlap as viewed from above.

As illustrated in FIGS. 4B and 4C, the capacitor C1 is disposed nearer to the top surface of the laminate 12 than the inductor L1. As viewed from all directions orthogonal or substantially orthogonal to the top side (that is, the front-rear direction and the right-left direction), the inductor L1 and the capacitor C1 therefore do not overlap.

In the LC filter 10, there is no capacitor on the front, rear, left, right, top, and bottom side of the inductor L1. That is, there is no capacitor overlapping the inductor L1 as viewed from above and all directions orthogonal or substantially orthogonal to the top side.

Since the relationship between the capacitor C2 and the inductor L2 is the same or substantially the same as the relationship between the capacitor C1 and the inductor L1, the description thereof will be omitted.

With the LC filter 10 having the above-described configuration, an inductance value is able to be increased. More specifically, the inductors L1 and L2 are provided with helical shapes such that they extend to the top side while turning around the axes Ax1 and Ax2 (see FIG. 4A) parallel or substantially parallel to the top-bottom direction, respectively. Each of the inductors L1 and L2 having the helical shape can obtain a larger inductance value than a loop-type inductor, because each of the inductors L1 and L2 has a configuration in which a large number of turns are provided in a small area.

With the LC filter 10, a Q value is able to be improved. More specifically, as illustrated in FIGS. 4B and 4C, the inductors L1 and L2 having the helical shapes generate magnetic fluxes $\phi1$ and $\phi2$ extending along the top-bottom direction, respectively. If there are capacitors above and below the inductors L1 and L2, the magnetic fluxes $\phi1$ and $\phi2$ pass through the capacitors and eddy currents are generated. The eddy currents decrease the Q value of the LC filter 10.

In addition, as illustrated in FIGS. 4B and 4C, the inductors L1 and L2 having the helical shapes generate magnetic fluxes $\phi3$ and $\phi4$ turning around the inductors L1 and L2, respectively. If there are capacitors on the front, rear, left, and right sides of the inductors L1 and L2, the magnetic fluxes $\phi3$ and $\phi4$ pass through the capacitors and eddy currents are generated. The eddy currents decrease the Q value of the LC filter 10.

In the LC filter 10, the inductor L1 and the capacitor C1 do not overlap as viewed from above and all directions orthogonal or substantially orthogonal to the top-bottom direction. The magnetic fluxes $\phi1$ and $\phi3$ generated by the inductor L1 are therefore prevented from passing through the capacitor C1. The inductor L2 and the capacitor C2 similarly do not overlap as viewed from above and all directions orthogonal or substantially orthogonal to the top-bottom direction. The magnetic fluxes $\phi2$ and $\phi4$ generated by the inductor L2 are therefore prevented from passing through the capacitor C2. As a result, the generation of eddy currents at the capacitors C1 and C2 is reduced or prevented and the Q value of the LC filter 10 is improved.

In the LC filter 10, a capacitance generated between the inductor L1 and the capacitor C1 and a capacitance generated between the inductor L2 and the capacitor C2 are reduced. More specifically, in the LC filter 10, the inductor L1 and the capacitor C1 do not overlap as viewed from above and all directions orthogonal or substantially orthogonal to the top-bottom direction. Accordingly, the plane of each conductive layer defining the inductor L1 and the plane of each conductive layer defining the capacitor C1 do not face each other, and the inductor L1 and the capacitor C1 are prevented from being close to each other in the front-rear direction and the right-left direction. As a result, a capacitance generated between the inductors L1 and the capacitor C1 is reduced. For the same reason, a capacitance generated between the inductors L2 and the capacitor C2 is reduced.

In the LC filter 10, a capacitance generated between each of the inductors L1 and L2 and the outer electrodes 14a to 14c is reduced. More specifically, the outer electrodes 14a to 14c are disposed on only the bottom surface of the laminate 12. That is, the outer electrodes 14a to 14c are not disposed on the front, rear, right, and left surfaces of the laminate 12. The outer electrodes 14a to 14c and each of the inductors L1 and L2 are therefore prevented from being close to each other. This reduces a capacitance generated therebetween.

In the LC filter 10, since the insulating layers 16m to 16r where unnecessary conductors are not disposed are provided between each of the inductors L1 and L2 and the bottom surface of the laminate 12, the distance between each of the inductors L1 and L2 and the outer electrodes 14a to 14c is increased. The levels of the magnetic fluxes $\phi1$ to $\phi4$ passing through the outer electrodes 14a to 14c therefore decrease. As a result, the generation of eddy currents at the outer electrodes 14a to 14c is reduced or prevented and the Q value of the LC filter 10 is improved. In addition, a capacitance generated between each of the inductors L1 and L2 and the outer electrodes 14a to 14c is reduced.

Furthermore, in the LC filter 10, a Q value is able to be improved for the following reasons. The relative dielectric constant of the insulating layers 16b to 16e sandwiched by the capacitor conductive layers 20a, 20b, 22, 24a, 24b, 26, 40a, 40b, and 42 in the top-bottom direction is preferably larger than that of the insulating layers 16g to 16l where the inductors L1 and L2 are disposed. The capacitance values of the capacitors C1 to C5 are therefore easily increased. That is, it is possible to reduce the areas of the capacitor conductive layers 20a, 20b, 22, 24a, 24b, 26, 40a, 40b, and 42 while maintaining the capacitance values of the capacitors C1 to C5. The levels of the magnetic fluxes φ1 to φ4 passing through the capacitor conductive layers 20a, 20b, 22, 24a, 24b, 26, 40a, 40b, and 42 therefore decrease. As a result, the Q value of the LC filter 10 is improved.

Since the capacitors C1 and C2 preferably have a rectangular or substantially rectangular shape, the capacitors C1 and C! are prevented from blocking the magnetic fluxes φ1 to φ4 generated ty the inductors L1 and L2 with more certainty and are able to have larger capacitances. More specifically, a region in which the inductors L1 and L2 are not provided has rectangular or substantially rectangular shape as viewed from above. In order to prevent the capacitors C1 and C2 and the inductors L1 and L2 from overlapping as viewed from above and to maximize the sizes of the capacitors C1 and C2, the capacitors C1 and C2 have rectangular or substantially rectangular shapes. That is, the capacitors C1 and C2 that are rectangular or substantially rectangular in shape are prevented from blocking the magnetic fluxes φ1 to φ4 generated ty the inductors L1 and L2 with more certainty and are able to have larger capacitances.

Figure 5A:
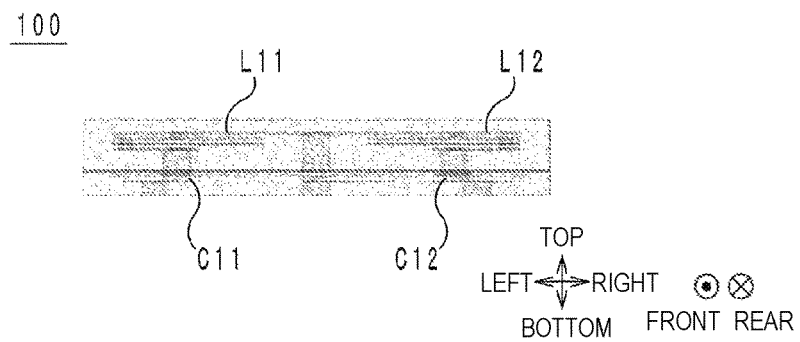
FIG. 5A is a perspective view of an LC filter 100 that is a comparative example taken from the front.
Figure 5B:
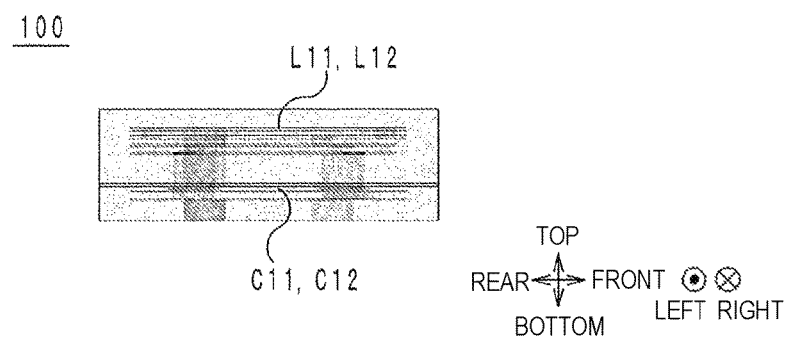
FIG. 5B is a perspective view of the LC filter 100 that is a comparative example taken from the left.

The inventor of preferred embodiments of the present invention performed a computer simulation to be described below to further clarify the effects provided by the LC filter 10. FIG. 5A is a perspective view of an LC filter 100 that is a comparative example taken from the front. FIG. 5B is a perspective view of the LC filter 100 that is a comparative example taken from the left.

The inventor created the LC filter 10 as a first model corresponding to a preferred embodiment of the present invention and the LC filter 100 as a second model corresponding to a comparative example. In the LC filter 100, an inductor L11 and a capacitor C11 overlap and an inductor L12 and a capacitor C12 overlap as viewed from above. The inductors L11 and L12 correspond to the inductors L1 and L2, respectively, and the capacitors C11 and C12 correspond to the capacitors C1 and C2, respectively. The equivalent circuit diagram of the LC filter 100 is the same or substantially the same as the equivalent circuit diagram of the LC filter 10.

Figure 5C:
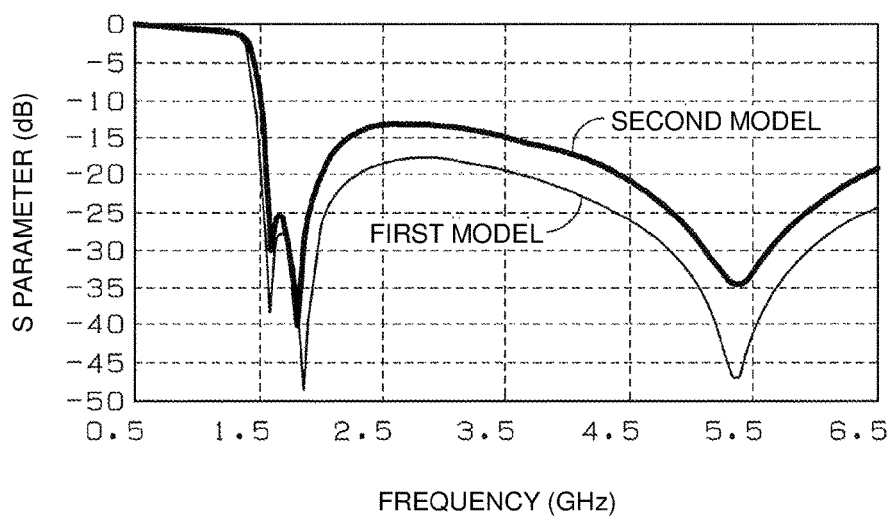
FIG. 5C is a graph representing a result of a computer simulation.

FIG. 5C is a graph representing a result of a computer simulation. A vertical axis represents bandpass characteristics and a horizontal axis represents frequencies. Table 1 indicates a result of a computer simulation.

TABLE 1

|  | Insertion Loss (IL) | Return Loss (RL) | Attenuation (ATT@1.575 GHz) | Attenuation (ATT@1.805 GHz) | Attenuation (ATT@5 GHz) |
| --- | --- | --- | --- | --- | --- |
| First Model | −0.176 dB | −23.5 dB | −28.1 dB | −46.9 dB | −30.8 dB |
| Second Model | −0.215 dB | −28.5 dB | −25.3 dB | −30.4 dB | −25.4 dB |

The Q value of the first model is better than that of the second model. As a result, it is apparent from FIG. 5C that the amount of attenuation of the first model is larger than that of the second model at frequencies higher than a cutoff frequency (1.575 GHz). Specifically, as indicated by Table 1, the amount of attenuation of the first model is larger than that of the second model at 1.575 GHz, 1.805 GHz, and 5 GHz that are attenuation poles. Accordingly, the fact that the Q value of the first model is better than that of the second model shows that good bandpass characteristics are obtained in the first model.

The Q value of the first model is better than that of the second model. As a result, an insertion loss (IL) of the first model is smaller than that of the second model as indicated by Table 1.

Figure 6:
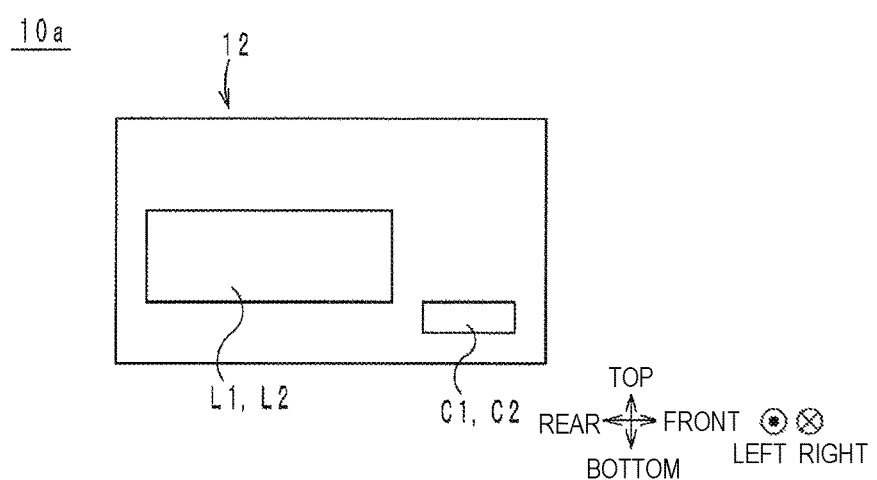
FIG. 6 is a schematic perspective view of an LC filter 10a according to a preferred embodiment of the present invention taken from the left.

An LC filter 10a that is a modification of a preferred embodiment of the present invention will be described below with reference to the accompanying drawing. FIG. 6 is a schematic perspective view of the LC filter 10a taken from the left.

In the LC filter 10, the capacitors C1 and C2 are disposed above the inductors L1 and L2. In the LC filter 10a, the capacitors C1 and C2 are disposed below the inductors L1 and L2 as illustrated in FIG. 6.

In the LC filter 10a, it is preferable that a plurality of insulating layers at which there is no via-hole conductor and no conductive layer be continuously provided above the inductors L1 and L2. Even if a metal is disposed near the top surface of the laminate 12, the generation of a capacitance between the metal and the inductors L1 and L2 is reduced or prevented because the metal is spaced apart from the inductors L1 and L2. In addition, magnetic fluxes generated by the inductors L1 and L2 are not significantly blocked by the metal.

LC filters according to the present invention are not limited to the LC filters 10 and 10a according to the above-described preferred embodiments, and may be changed within the scope of the present invention.

The configuration of the LC filter 10 and the configuration of the LC filter 10a may be optionally combined.

The inductor L1 and the capacitor C1 define the LC parallel resonator LC1, but may define an LC series resonator. The inductor L2 and the capacitor C2 define the LC parallel resonator LC2, but may define an LC series resonator.

The outer electrodes 14a to 14c are disposed on only the bottom surface of the laminate 12, but may be disposed in a portion other than the bottom surface.

The land conductive layers 60 do not necessarily have to be provided.

The inductors L1 and L2 have helical shaped, but may have spiral shapes.

The insulating layers 16a to 16t may have the same relative dielectric constant.

The LC filter 10 is a low-pass filter, but may be a high-pass filter or a bandpass filter.

As described above, preferred embodiments of the present invention are useful for LC filters, and, in particular, has an advantage in its ability to obtain a large inductance value and an improving a Q value.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An LC filter comprising:
   a laminate including a plurality of insulating layers laminated in a lamination direction;
   an inductor having a spiral or helical shape around an axis parallel or substantially parallel to the lamination direction; and a capacitor in which a plurality of capacitor conductors face each other; wherein the inductor and the capacitor define an LC resonator; and the inductor and the capacitor do not overlap as viewed from the lamination direction and all directions orthogonal or substantially orthogonal to the lamination direction.

2. The LC filter according to claim 1, wherein the plurality of capacitor conductors have a rectangular or substantially rectangular shape.

3. The LC filter according to claim 1, wherein the laminate includes a bottom surface located at one end in the lamination direction; and the LC filter further includes an outer electrode that is electrically connected to the inductor and the capacitor and is disposed on the bottom surface.

4. The LC filter according to claim 3, wherein the outer electrode is disposed on only the bottom surface.

5. The LC filter according to claim 3, wherein the laminate further includes a top surface located at another end in the lamination direction; and the capacitor is disposed nearer to the top surface than the inductor is to the top surface.

6. The LC filter according to claim 5, wherein, two or more of the plurality of the insulating layers which are provided between the inductor and the bottom surface, no conductor is provided other than a via-hole conductor passing through the insulating layers in a straight line in the lamination direction and a land conductor relaying a connection of the via-hole conductor at a boundary between the two or more of the plurality of insulating layers.

7. The LC filter according to claim 1, wherein, in the inductor, a plurality of inductor conductors that are provided on respective insulating layers of the plurality of insulating layers and extend around the axis and one or more via-hole conductors passing through the insulating layers are connected.

8. The LC filter according to claim 1, wherein a relative dielectric constant of one of the plurality of insulating layers that is sandwiched by the plurality of capacitor conductors in the lamination direction is higher than a relative dielectric constant of the plurality of insulating layers at which the inductor is disposed.

* * * * *